United States Patent
Brinkman et al.

(10) Patent No.: US 7,259,585 B2
(45) Date of Patent: Aug. 21, 2007

(54) SELECTIVE ON-DIE TERMINATION FOR IMPROVED POWER MANAGEMENT AND THERMAL DISTRIBUTION

(75) Inventors: Michael G. Brinkman, Raleigh, NC (US); Matthew A. Eckl, Raleigh, NC (US); Jimmy G. Foster, Sr., Morrisville, NC (US); Kwok Hon Yu, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/237,434

(22) Filed: Sep. 28, 2005

(65) Prior Publication Data

US 2007/0080707 A1 Apr. 12, 2007

(51) Int. Cl.
*H03K 19/003* (2006.01)
(52) U.S. Cl. ............................. 326/30; 326/32; 326/33
(58) Field of Classification Search ............ 326/30–34, 326/86
See application file for complete search history.

(56) References Cited

U.S. PATENT DOCUMENTS

| | | |
|---|---|---|
| 6,271,704 B1 | 8/2001 | Babcock et al. |
| 7,157,932 B2 * | 1/2007 | El-Kik et al. .................. 326/32 |
| 2003/0016512 A1 | 1/2003 | McCall et al. |
| 2003/0016514 A1 | 1/2003 | McCall et al. |
| 2003/0016516 A1 | 1/2003 | McCall et al. |
| 2003/0016517 A1 | 1/2003 | McCall et al. |
| 2003/0018940 A1 | 1/2003 | McCall et al. |
| 2003/0099138 A1 * | 5/2003 | Kyung ....................... 365/200 |
| 2003/0197525 A1 | 10/2003 | Song et al. |
| 2004/0228196 A1 | 11/2004 | Kwak et al. |

* cited by examiner

*Primary Examiner*—Anh Q. Tran
(74) *Attorney, Agent, or Firm*—Cynthia S. Byrd; Dillon & Yudell LLP

(57) ABSTRACT

A system, method and device for managing power distribution on a shared bus system that interconnects multiple devices each containing a signal termination component are disclosed herein. In one embodiment, the method of the invention includes detecting and communicating thermal indicia of one or more of the devices in the shared bus system to a memory controller device. The memory controller includes an on-die termination control circuit for setting and resetting the enablement of the signal termination components of the one or more devices. In a preferred embodiment, the on-die termination control circuit sets and resets the enablement of the signal termination components in accordance with the determined thermal indicia.

18 Claims, 3 Drawing Sheets

SELECTIVE ON-DIE TERMINATION FOR IMPROVED POWER MANAGEMENT AND THERMAL DISTRIBUTION

BACKGROUND OF THE INVENTION

1. Technical Field

The present invention relates generally to power distribution management in electronic systems, and in particular, to a method and system for distributing heat sources among electronic devices having on-board signal terminations. More particularly, the present invention relates to a method and system for strategically enabling and disabling on-die terminations in accordance with power distribution and thermal related factors.

2. Description of the Related Art

Electronic systems using shared bus architectures such as synchronous dynamic random access memory (SDRAM) systems are being fabricated onto increasingly dense circuit structures and are operating at higher speeds, resulting in thermal generation/dissipation problems. An example is double data rate (DDR) SDRAM, which is utilized in high-performance main memory. One solution to the increased localized heat generation is to throttle device/bus operating speeds to a maximum number of cycles over a specified period. By reducing overall power consumption, this approach is effective in reducing heat generation. However, since operating speed is directly or indirectly a system or sub-system parameter, system performance may be unduly compromised and individualized component attention or protection impracticable.

Signal termination is another significant heat contributor in many shared bus systems. Generally, signal termination is utilized to eliminate noise caused by signal reflections on shared transmission paths. Motherboard termination is a termination method that reduces signal reflection by attaching a resistor (termination resistance) having a suitable resistance value to the end of each transmission path. However, this method does not reduce signal reflection sufficiently in the operating frequency range used by DDR2-SDRAM or other very high speed applications. In addition, adding termination resistors to the motherboard increases the component count and raises manufacturing and design costs.

On-die termination (ODT) is an alternate signal termination method that is more effective than motherboard termination in removing signal reflection noise in a shared bus environment having multiple active mode DRAMs that may be affected by reflected signals from DRAMs in a standby mode. For example, DDR2-SDRAM using ODT signal termination contains termination resistors that would otherwise be mounted onto the motherboard, thereby reducing the number of components on the motherboard and simplifying system design.

Both motherboard and ODT types of signal termination release heat as a byproduct of the signal "absorption" process, and therefore may exacerbate heat generation problems in shared bus systems. Accordingly, there is a need for an improved system and method that more effectively manage power distribution in systems using signal terminations. The present invention addresses this need and other needs unaddressed by the prior art.

SUMMARY OF THE INVENTION

A system, method and device for managing power distribution on a shared bus system that interconnects multiple devices each containing a signal termination component are disclosed herein. In one embodiment, the method of the invention includes steps of detecting and communicating thermal indicia of one or more of the devices in the shared bus system to an on-die termination control circuit within a memory controller device. The on-die termination control circuit includes electronic devices, modules, and instruction means for setting and resetting the enablement of the signal termination components of the shared interconnect devices. In a preferred embodiment, the on-die termination control circuit sets and resets the enablement of the signal termination components in accordance with the determined thermal indicia.

In one embodiment, a memory system includes a memory module containing multiple memory devices, such as dynamic random access memory (DRAM) devices, in respective independently selectable banks. The memory devices within the memory module include selectively enabled/disabled on-die termination circuits that provide a termination impedance at their respective data terminals responsive to a memory control signal at the commonly connected memory control signal terminals on the shared interconnect. The selectively-enabled on-die termination circuits provide specified termination impedances responsive to corresponding signal termination enablement signals from the ODT control circuit. For example, the ODT control circuit may determine the enablement of the ODT circuits responsive to memory read and write operations or other indicia of memory device activity.

In other embodiments of the invention, control of the respective ODT circuits may be distributed such that each of the ODT circuits includes a respective ODT control circuit configured to set the enablement/disablement of the corresponding ODT circuit in accordance with thermal indicia such as received memory control signals and/or signals indicating thermal conditions of the memory module. Each ODT circuit comprises a signal termination circuit configured to receive an ODT control signal and to selectively provide a first, signal-terminating impedance and second, non-signal-terminating termination impedance at the terminal of the memory device responsive to respective first and second states of the ODT control signal.

The ODT control circuit may comprise decoder means operative to generate a signal termination enable or disable signal responsive to detected thermal conditions such as may be derived from memory control signals, power supply signals, thermal gauges, and other direct or indirect indicia of thermal and power distribution in the memory module.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT(S)

The present invention is directed to a system and method for power distribution management in shared bus systems having devices employing on-die signal termination. The most well-known of such systems are those employing on-die termination (ODT) on the integrated circuit devices and are in contrast to shared bus systems that utilize printed circuit board termination, such as motherboard signal termination. As explained in further detail below with reference to the figures, the present invention provides a power distribution management technique in which the portion of system power consumption consisting of signal termination is distributed and dynamically adjusted in accordance with relative determined thermal indicia such as device temperature, power consumption, etc., such that the power load comprising signal termination may be shifted to alleviate areas of the system that are otherwise subject to overheating.

Figure 1:
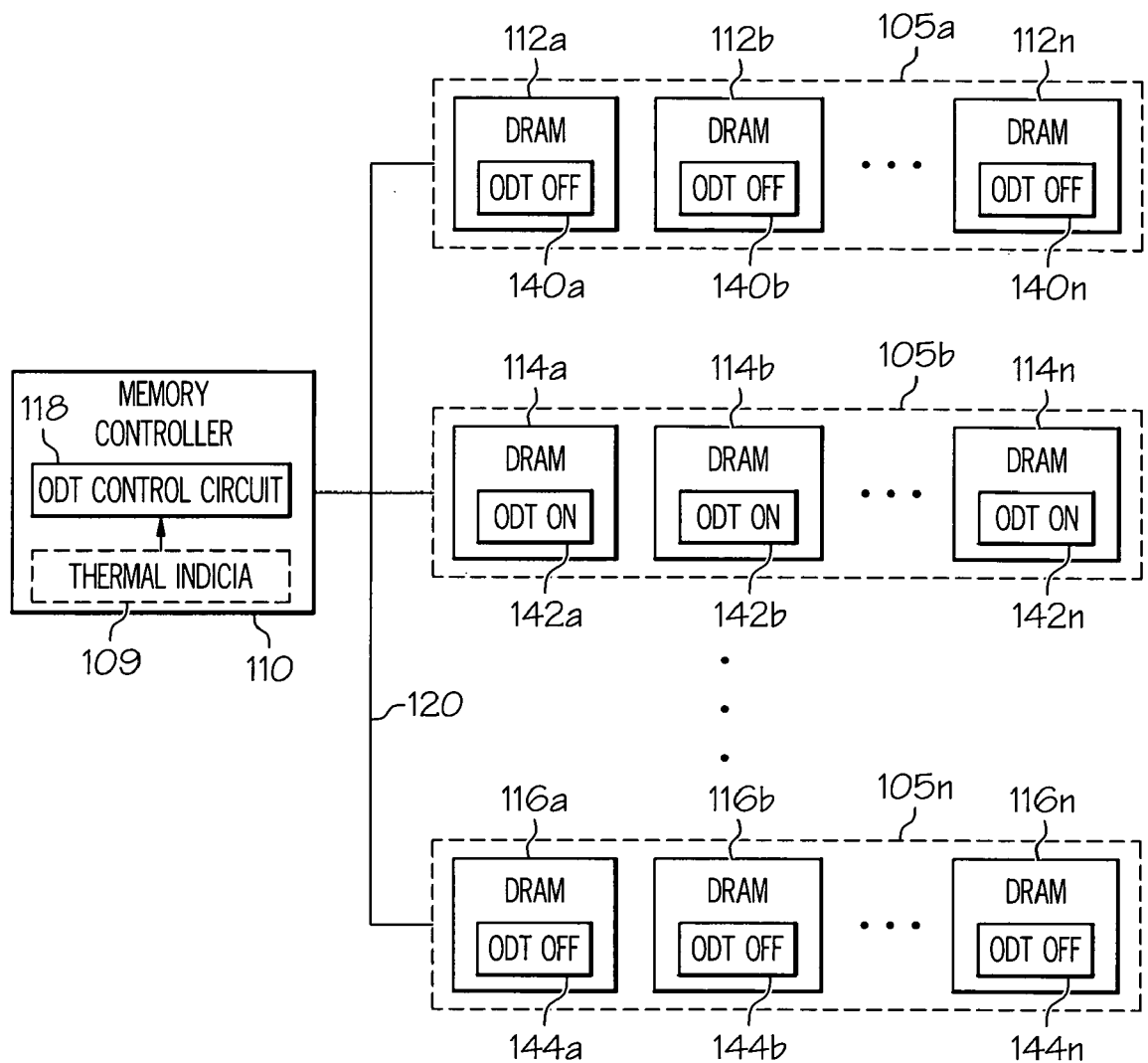
FIG. 1 is a high-level block diagram depicting a shared bus system in which on-die termination devices are interconnected in accordance with the present invention.

With reference now to the figures, wherein like reference numerals refer to like and corresponding parts throughout, and in particular with reference to FIGS. 1 and 2, there is illustrated a shared bus system in which memory devices are interconnected in accordance with the present invention. As shown in FIG. 1, the shared bus system generally comprises multiple memory modules 105a-105n coupled to a memory controller 110 via a system interconnect 120. Depending on the system configuration, system interconnect 120 may be a bus or switched interconnect that provides communicative coupling between memory controller 110 and the devices within memory modules 105a-105n.

In a preferred embodiment, memory modules 105a-105n comprise multiple ranks of devices referred to in the art as dual in-line memory modules (DIMMs), each of which contains multiple dynamic random access memory (DRAM) chips on a small circuit board having edge connector pins for coupling to a motherboard (not depicted). In such a case, each of the integrated circuits onboard the modules 105a, 105b, and 105n are DRAM devices represented by blocks 112a-112n, 114a-114n, and 116a-116n (alternately referred to as DRAM devices 112, 114, and 116 for ease of reference). While the exemplary embodiments depicted herein include a shared bus DIMM memory configuration, it should be noted that the present invention is not limited to memory devices or a particularly memory device configuration and may be applied to other electronic devices that support on-device signal termination such as ODT.

As further depicted in FIG. 1, DRAM devices 112, 114, and 116 include signal termination components in the form of ODT circuits 140a-140n, 142a-142n, and 144a-144n, respectively (referred to collectively herein as ODT circuits 140, 142 and 144 for ease of reference). The enablement of the ODT circuits 140, 142, and 144 is typically controlled by applying a control signal from memory controller 110 to ODT control pins, functionally represented as switches 135 in FIG. 2A. With the representative control switches 135 in the open position (representing effective removal of ODT enable signal from the corresponding one of the ODT input control pins), the signal termination functionality, represented by termination resistors, $R_{TD}$ and $R_{TS}$, and pull-up and pull-down voltages $V_{DD}$ and $V_{SS}$, is deactivated or equivalently disabled such that the corresponding ODT circuit does not function to sink, or terminate, signals received at input pins 134 from shared interconnect 120. To enable any one or more of ODT circuits 140, 142, and/or 144, an enable signal is sent to the respective enable pin inputs to effectively close the circuit between termination resistor, $R_T$, and the reference voltage (represented in the depicted embodiment by "closing" the control pin) thus providing a signal-terminating impedance. The signal termination functionality is in this manner activated or equivalently enabled such that the corresponding ODT circuit sinks, or terminates, signals received at input pins 134 from shared interconnect 120.

Figure 2A:
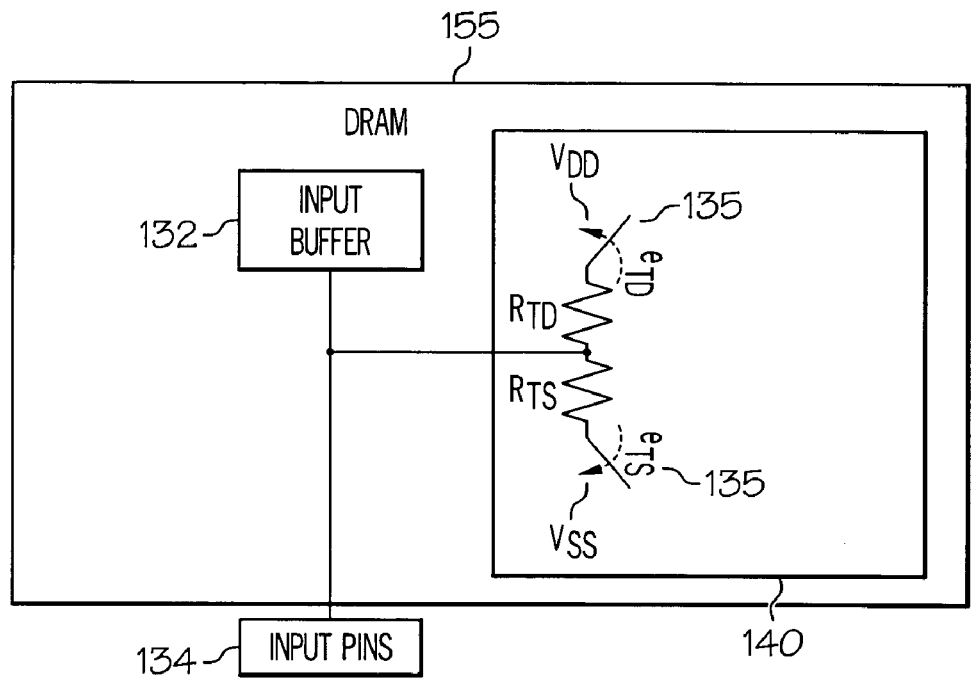
FIG. 2A is block diagram illustration of a memory device having a signal termination component that is selectively enabled and disabled in accordance with an embodiment of the present invention.
Figure 2B:
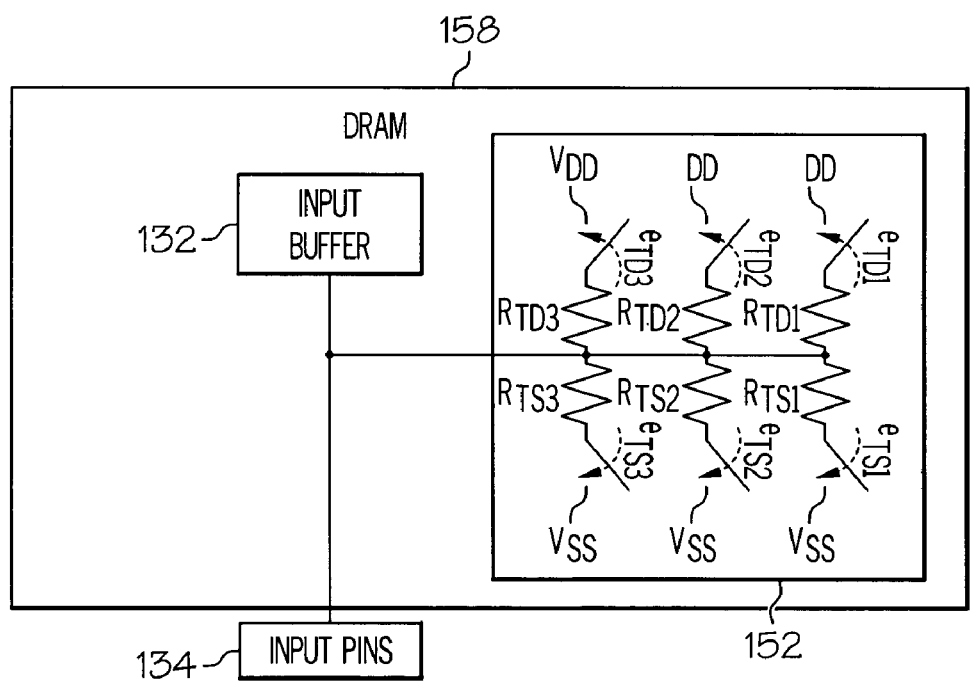
FIG. 2B is a block diagram illustration of a memory device having a signal termination component that is selectively enabled and disabled in accordance with an alternate embodiment of the present invention.

FIGS. 2A and 2B provide more detailed block diagram illustrations of the internal structures of alternate exemplary DRAM devices particularly as they relate to power distribution management according to the present invention. DRAM devices 155 and 158 each buffer data within an input buffer 132 that has been received from input pins 134. DRAM device 155 includes an ODT circuit 140 comprising termination resistors, $R_{TD}$ and $R_{TS}$, and switches 135 forming respective paths to a signal sinking terminations, in this case represented by $V_{DD}$ and $V_{SS}$. The termination resistors, $R_{TD}$ and $R_{TS}$, represent one or more passive and/or active electronic devices providing a specified, possibly frequency-dependent impedance to signals received at input pins 134. Switches 135 represent the ODT enable input pin on the IC chip housing DRAM 155 that receives ODT control signals $e_{TD}$ and/or $e_{TS}$ generated/encoded by a signal termination control circuit in the form of an ODT control circuit 118.

DRAM device 158 provides an ODT circuit 152 designed in accordance with an alternative embodiment of the present invention. Specifically, ODT circuit 152 comprises a pull-up net comprising parallel coupled termination resistors $R_{TD1}$-$R_{TD3}$ series coupled to a pull-down net comprising parallel coupled termination resistors $R_{TS1}$-$R_{TS3}$. In this configuration one or more of the resistor paths may be selectively opened or closed by corresponding in-line switches $e_{TD1}$-$e_{TD3}$ and $e_{TS1}$-$e_{TS3}$. In this manner, the effective termination resistance for ODT circuit 152 is determined by the encoding of one or more ODT control signals $e_{TD1}$-$e_{TD3}$ and $e_{TS1}$-$e_{TS3}$ in accordance with thermal indicia as described in further detail below with reference to FIG. 3.

In one embodiment, termination resistors $R_{TD1}$-$R_{TD3}$ and $R_{TS1}$-$R_{TS3}$ can be individually placed online by asserting one or more of the corresponding enable signals $e_{TD1}$-$e_{TD3}$ and $e_{TS1}$-$e_{TS3}$. In an alternate embodiment, pull-up and pull-down pairs (e.g. $R_{TD1}/R_{TS1}$) can be controlled as selectable units by encoding the ODT control signals such that corresponding signals are asserted ($e_{TD1}/e_{TS1}$ for $R_{TD1}/R_{TS1}$). In still an alternate embodiment, ODT control circuit 118 may assert ODT control signals $e_{TD1}$-$e_{TD3}$ and $e_{TS1}$-$e_{TS3}$ in any encoded combination as dictated by the required input signal impedance.

Returning to FIG. 1, the signal terminations of ODT circuits 140 and 144, within memory modules 105a and 105n, respectively, are disabled ("OFF"), while the signal terminations of ODT circuits 142 within memory module 105b are enabled ("ON"). In this depicted embodiment, the enablement/disablement status of the ODT circuits are thus controlled in groupings of DRAM devices determined by inclusion on a particular memory module. In alternate embodiments, the enablement/disablement status of the ODT circuits may be set on a group basis where within a DIMM, different groups of DRAMs may be set individually.

As utilized in most shared interconnect memory systems, memory controller 110 is generally a device that controls by electronic communications protocols and standards the transfer of data from various components of the computer (not depicted) to and from the DRAM devices 112, 114, and 116 within memory modules 105a-105n. If utilized in a personal computer system, for example, memory controller 110 would typically comprise a single IC chip.

In addition to its standard circuitry and components for facilitating memory bus transactions, which are not necessary for an understanding of the invention and therefore not depicted, memory controller 110 includes an ODT control circuit 118. In a preferred embodiment, ODT control circuit 118 includes electronic and/or program modules and instructions for determining and implementing enablement/disablement of the ODT circuits 140, 142, and 144 within DRAM devices 112, 114, and 116. For the depicted embodiment, in which the enablement status of each of ODT circuits 140, 142, and 144 is set by an enable/disable signal sent or removed from an enable input pin (represented as switches in FIGS. 2A and 2B) in the IC chip (represented by DRAM device blocks 112, 114, and 116), the functionality of ODT control circuit 118 fundamentally comprises electronic and/or program modules for determining which enable signals to assert and which to de-assert under given conditions.

A useful feature of the power distribution management function of the invention is to enable/disable the ODT circuits 140, 142, and 144 in accordance with thermal indicia data 109 preferably received and processed by memory controller 110. As utilized herein, "thermal indicia" may refer generally to any direct or indirect data or information that provides a direct or indirect indication of the power distribution or absolute or relative thermal conditions occurring proximate to or within memory modules 105a-105n. Sources of such thermal indicia 109 may include direct thermal indicia such as temperature measurements collected from thermal measuring devices such as thermal diodes (not depicted). Thermal indicia 109 may also or instead comprise indirect thermal indicia such as power consumption data derived from bus transaction activities as monitored by memory controller 110. In one embodiment, indirect thermal indicia contained in thermal indicia 109 may include relative thermal indicia data that accounts for the mutual impact of thermal conditions across multiple pre-specified zones each comprising one or more of ODT circuits 140, 142, and 144. An example of relative thermal indicia that may be utilized in this manner is relative airflow direction among the memory modules as depicted and explained with reference to FIG. 4.

Thermal indicia 109, which may comprise the aforementioned and other thermal and/or power distribution information, is received and utilized by ODT control circuit 118 to determine the enablement status of ODT circuits 140, 142, and 144 (i.e. determine which ODT circuits to enable or disable) in the respective DRAM devices 112, 114, and 116. The process by which ODT control circuit sets the enablement status of ODT circuits 140, 142, and 144 is now described with reference to FIG. 3.

Figure 3:
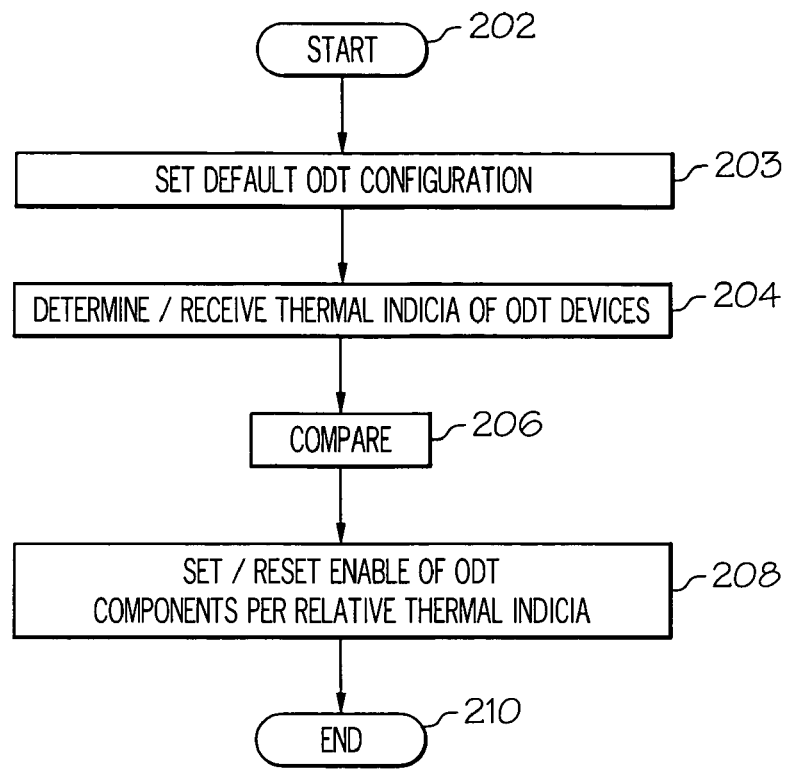
FIG. 3 is a high-level flow diagram of steps performed during power distribution management in accordance with the present invention.

FIG. 3 is a high-level flow diagram depicting steps performed during power distribution management within the memory system shown in FIG. 1 in accordance with the present invention. The process begins as shown at steps 202 and 203 with ODT control circuit 118 generating and sending ODT enable and/or disable signals to the ODT control pins 135 of the respective ODT devices 140, 142, and 144 to set the default ODT configuration. The default configuration is preferably pre-programmed in the circuit and/or program modules of ODT control circuit 118 such that a desired signal termination power distribution configuration can be achieved within memory modules 105a-105n prior to detection and receipt of thermal indicia 109 collected during memory system operation. In one embodiment, the default ODT configuration implemented as shown at step 203 may represent an initial configuration that is modified in accordance with thermal indicia as explained in further detail below.

The power distribution management process continues as shown at step 204 with a determination of one or more indicators of thermal conditions or power consumption (referred to collectively herein as "thermal indicia") occurring in one or more of the DRAM devices 112, 114, and 116 within memory modules 105a-105n. The determination of thermal indicia may include detection of direct thermal data such as may be obtained from thermal diodes (not depicted) proximately positioned to estimate the temperature of the one or more of DRAM devices 112, 114, and 116 or memory modules 105a-105n. In an alternate embodiment, the determination of thermal indicia may comprise an indirect assessment of thermal conditions in accordance with memory device activity. For example, memory controller 110 may track as thermal indicia 109 the level of bus transaction activity associated with the respective DRAM devices 112, 114, and 116 coupled to interconnect 120. In an alternate embodiment, the thermal indicia determination shown at step 204 may comprise computing the power load (including or not including ODT load contribution) delivered to one or more of DRAM devices 112, 114, and 116. Other thermal indicia may include ambient air temperature, local (with respect to one or more of DRAM devices 112, 114, and 116) air temperature, airflow direction, airflow rate, etc.

Figure 4:
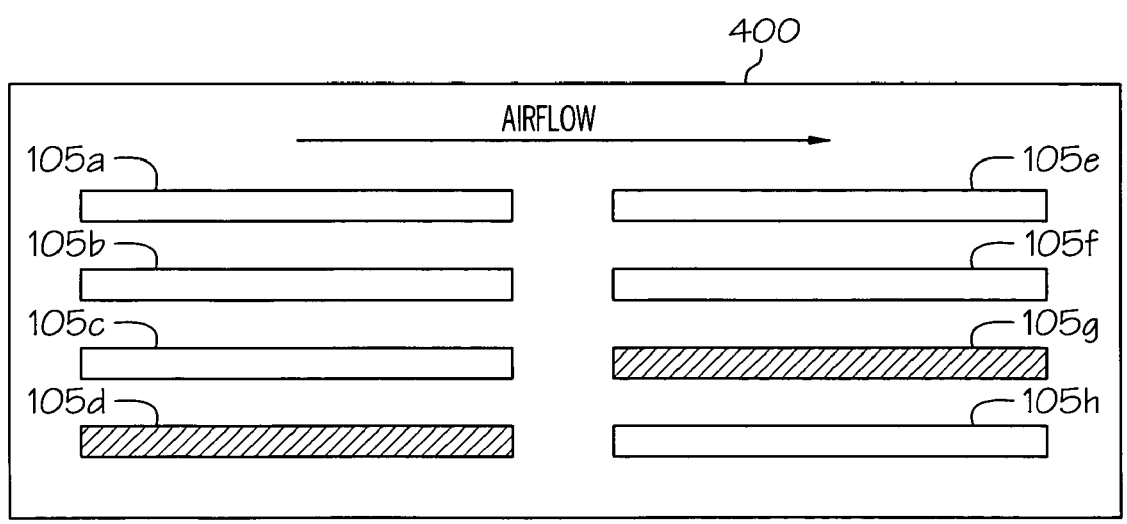
FIG. 4 depicts an arrangement of memory modules on a motherboard in which the power distribution management function of the present invention may be applied.

The determination of thermal indicia data may further include determining the thermal impact of one or more specified zones of one or more of memory modules 105a-105n on other zones defined over or within a specified area or space. Namely, and referring to FIG. 4, there is depicted a block diagram representation of a memory apparatus comprising a motherboard 400 on which several memory modules 105a-105h are installed. As shown in FIG. 4, memory modules 105a-105h are arranged in a specified mutual proximity on motherboard 400 as is typically determined by the positioning of edge connector slots on the board. In the depicted example, the shading of modules 105d and 105g indicates that these modules are operating at a relatively high power mode such as may be determined by bus transaction activity or otherwise. In contrast, the unshaded representation of modules 105a, 105b, 105c, 105e, 105f, and 105h indicates that these modules are presently operating in a relatively low power mode. The determination of high or low power operating mode may be determined relatively or with respect to an absolute scale. In accordance with the depicted embodiment at step 204, memory controller 110 includes as thermal indicia 109, that modules 105a, 105b, 105c, 105e, 105f, and 105h are presently operating in a low power mode. The present high power operating mode of modules 105d and 105g is also utilized and included as thermal indicia 109 by memory controller 110. In addition to the relative power distribution among the memory modules, memory controller 110 further includes the direction of the airflow across motherboard 400 (left to right) as thermal indicia to be utilized in combination with the relative power distribution data (i.e. "high" or "low" power operating modes) for power distribution management.

As next illustrated at step 206, the power distribution management processing continues with ODT control circuit 118 comparing and/or otherwise processing the thermal indicia 109 to determine the relative thermal conditions of the DRAM devices 112, 114, and 116 in the shared interconnect system. As a basic principle of comparison in one embodiment, the comparison performed as shown at step 206 fundamentally comprises determining the relative levels of thermal activity or power consumption among DRAM devices 112, 114, and 116.

In one alternate embodiment, the default ODT configuration setting depicted at step 203 is a steady-state ODT configuration in which, for example, the ODT termination load is applied to one or more DRAM devices 112, 114, and 116 that are currently passive and disabled from currently active DRAM devices 112, 114, and 116 (i.e. processing a memory transaction from interconnect 120). In this embodiment, thermal indicia 109 may be compared in a relative manner or may be compared to pre-specified thresholds (step 206) to determine the setting of the enablement of ODT devices 140, 142, and 144.

Following determination and comparison of the thermal indicia 109, ODT control circuit 118 sets the enablement of the ODT circuits 140, 142, and 144 for the respective DRAM devices 112, 114, and 116 as illustrated at step 208. For example, and in one embodiment, ODT control circuit 118 enables the one or more ODT circuits 140, 142, and 144 contained within DRAM devices 112, 114, and 116 having corresponding thermal indicia indicating a lower level of thermal activity while disabling the ODT circuits 140 of DRAM devices 112 having corresponding thermal indicia indicating a higher level of thermal activity. As explained above with reference to FIGS. 2A and 2B, ODT control circuit 118 may assert ODT control signals $e_{TD1}$-$e_{TD3}$ and $e_{TS1}$-$e_{TS3}$ in various encoded combinations as dictated by the required input signal impedance. In the embodiment shown in FIG. 2B, in which the signal termination component is an ODT circuit comprising a pull-up net serially coupled to a pull-down net wherein said pull-up net and pull-down net form complimentary pull-up and pull-down component pairs, the encoding of ODT enable signals may include encoding the termination control signals to selectively enable each of the complimentary pull-up and pull-down component pairs individually.

In an alternate embodiment, and referring back to FIG. 4, the thermal indicia comparing step shown at step 206 comprises combining the high/low power mode data for each of modules 105a-105h with the airflow direction data to determine ODT enablement in accordance with thermally related zones. For example, the comparison step 206 may process the indicia indicating the depicted left-to-right airflow with the indicia that both modules 105b and 105f are presently relatively inactive (low power mode), to determine at step 208 that module 105b is eligible for enablement of its resident ODT circuits. In contrast, the processing of the airflow direction data in combination with highly active status of module 105g may result in a determination by ODT control circuit 118 that the ODT circuits onboard module 105c are less eligible for enablement, or in the alternative, have a higher eligibility for disablement if currently enabled.

In the foregoing manner, ODT control circuit 118 utilizes the received thermal indicia 109 to distribute and shift, as necessary, the power load comprising signal termination to alleviate areas of the system that are otherwise subject to overheating and enabling more efficient system packaging and containment. In one embodiment, consistent with the module groupings depicted in FIG. 1, the enablement settings of the ODT circuits is determined on a memory module level such that indicia relating to individual DRAM devices or groups of DRAM devices contained in a module is used to determine the ODT enablement setting of all DRAM devices within a given memory module.

While the invention has been particularly shown and described with reference to a preferred embodiment, it will be understood by those skilled in the art that various changes in and detail may be made therein without departing from the spirit and scope of the invention.

What is claimed is:

1. A method for managing power distribution among multiple interconnected devices each containing a signal termination component, said method comprising:
   receiving thermal indicia of one or more of the devices;
   setting enablement of the signal termination component of one or more of the devices in accordance with said received thermal indicia;
   comparing the received thermal indicia to determine relative power consumption of the devices; and
   wherein said setting enablement step comprises setting enablement of the signal termination component of one or more of the devices in the shared bus system in accordance with the determined relative power consumption of the devices.

2. The method of claim 1, wherein the signal termination component receives one or more termination control signals, said setting enablement of the signal termination component of one or more of the devices further comprising encoding said termination control signals individually or in combination.

3. The method of claim 2, wherein the signal termination component comprises a pull-up net serially coupled to a pull-down net, wherein said pull-up net and pull-down net comprise complimentary pull-up and pull-down component pairs, said encoding and decoding further comprises encoding and decoding said termination control signals to selectively enable the complimentary pull-up and pull-down component pairs.

4. The method of claim 1, wherein said setting enablement step comprises setting enablement of the signal termination component of a first group of one or more of said devices in accordance with the signal termination setting of a second group of one or more devices interconnected separately from the first group.

5. A method for managing power distribution among multiple interconnected devices each containing a signal termination component, said method comprising;
   receiving thermal indicia of one or more of the devices;
   setting enablement of the signal termination component of one or more of the devices in accordance with said received thermal indicia; and
   determining thermal indicia of said one or more of the devices, wherein said determining thermal indicia comprises identifying a first device having indicia of higher thermal activity and a second device having indicia of lower thermal activity, said setting enablement of the signal termination component of one or more of the devices comprising disabling the signal termination component of the first device and enabling the signal termination component of the second device.

6. The method of claim 1, wherein said thermal indicia are included among the group comprising:
   device temperature;
   device activity level; or
   computed device power consumption.

7. The method of claim 5, wherein said devices are interconnected on a shared bus or point-to-point channel connection, wherein said determining thermal indicia comprises determining a level of bus or channel transaction activity for one or more of the devices.

8. The method of claim 5, wherein said determining thermal indicia comprises computing the power load delivered to one or more of the devices.

9. The method of claim 1, wherein the signal termination component in each of the devices is an on-die termination component, said setting enablement step comprising setting an enable signal at an on-die termination component enable input on one or more of the multiple devices.

10. A system for managing power distribution on a shared bus system that interconnects multiple devices each containing a signal termination component, said system comprising a signal termination control circuit for:
   receiving thermal indicia of one or more of the devices;
   setting enablement of the signal termination component of one or more of the devices in accordance with said received thermal indicia; and
   wherein the signal termination control circuit:
      compares the received thermal indicia to determine relative power consumption of the devices; and
      sets enablement of the signal termination component of one or more of the devices in accordance with the determined relative power consumption of the devices.

11. The system of claim 10, wherein the signal termination component receives one or more termination control signals from said signal termination control circuit, said signal termination control circuit encoding said termination control signals individually or in combination.

12. The system of claim 11, wherein the signal termination component comprises a pull-up net serially coupled to a pull-down net, wherein said pull-up net and pull-down net comprise complimentary pull-up and pull-down component pairs, said signal termination control circuit further encoding said termination control signals to selectively enable the complimentary pull-up and pull-down component pairs.

13. The system of claim 10, wherein said signal termination control circuit enables or disables the signal termination component of one or more of the devices in accordance with said received thermal indicia.

14. The method of claim 10, further comprising a thermal detection device for determining thermal indicia of said one or more of the devices, wherein said determining thermal indicia comprises identifying a first device having indicia of higher thermal activity and a second device having indicia of lower thermal activity, said setting enablement of the signal termination component of one or more of the devices comprising disabling the signal termination component of the first device and enabling the signal termination component of the second device.

15. The system of claim 10, wherein said thermal indicia are included among the group comprising:
   device temperature;
   device activity level; or
   computed device power consumption.

16. The system of claim 14, wherein said devices are interconnected on a shared bus or point-to-point channel connection, wherein said determining thermal indicia comprises determining a level of bus or channel transaction activity for one or more of the devices.

17. The system of claim 14, wherein said determining thermal indicia comprises computing the power load delivered to one or more of the multiple devices.

18. The system of claim 10, wherein the signal termination component in each of the devices is an on-die termination component, said setting enablement of the signal termination component of one or more of the devices comprising setting an enable signal at an on-die termination component enable input on one or more of the multiple devices.

* * * * *